United States Patent [19]

Chang et al.

[11] Patent Number: 5,130,667
[45] Date of Patent: Jul. 14, 1992

[54] DIFFERENTIAL TRANSIMPEDANCE AMPLIFIER

[75] Inventors: Gee-Kung Chang; James L. Gimlett, both of Holmdel; Ting-Ping Liu, Red Bank, all of N.J.

[73] Assignee: Bell Communications Research Inc., Livingston, N.J.

[21] Appl. No.: 683,865

[22] Filed: Apr. 11, 1991

[51] Int. Cl.$^5$ .............................................. H03F 3/45
[52] U.S. Cl. .................................... 330/253; 330/308; 330/311
[58] Field of Search ................... 330/59, 69, 252, 253, 330/308, 310, 311; 329/348, 354, 364, 365; 250/214 A; 359/189, 195

[56] References Cited

U.S. PATENT DOCUMENTS 4,594,562 6/1986 Gurke et al. ...................... 330/307

OTHER PUBLICATIONS

"Optical Receiver Amplifier Front End for Diffuse Infrared Communication", *IBM Technical Disclosure Bulletin,* vol. 29, No. 8, Jan. 1987, pp. 3720, 3721.
Wyland, "Fet Cascade Technique Optimizes Differential Amplifier Performance", *Electronics,* Jan. 18, 1971, pp. 81–84.
"A Wide-Band Low-Noise Monolithic Transimpedance Amplifier", Meyer & Blauschild, IEEE, vol. SC-21, No. 4, Aug. 1986, pp. 530–533.
"New Monolithic AGC Amplifier Stabilising Output DC Level for 560 Mbit/s Optical Transmission", Kinoshita et al., Electronics Letters, vol. 22, No. 8, Apr. 1986.
"A 1.5 Gbit/sGaAs Four-Channel Selector LSI w/Monolithically Integrated Newly Structured GaAs Ohmic Contact MSM Photodetector & Laser Driver", Tamanaka & Takada, IEEE, vol. 1, Oct. 1989, pp. 310–312.
"A 3 GHz Transimpedance OEIC Receiver for 1.3–1.55 μm Fiber-Optic Systems", Chang et al., IEEE, vol. 2, No. 3, Mar. 1990, pp. 197–199.
"A 2 Gb/s Throughput GaAs Digital Time Switch LSI using LSCFL", Takada et al., IEEE, vol. MTT-33, No. 12, Dec. 1985, pp. 1579–1584.
"A Highly Integrated 20 MBIT/S GaAs Optical Receiver for Use in TPON Network Termination Equipment", Back et al., Electronic Letters, Apr. 1991.

*Primary Examiner*—James B. Mullins

[57] ABSTRACT

A wideband transimpedance amplifier utilizing a differential amplifier circuit structure whereby the differential pair is bridged by a signal detector which, as an example, would be a photodetector when the transimpedance amplifier is employed within a optical receiver. In order to bias the signal detector the differential pair is operated asymmetric with respect to the DC voltage but the circuit maintains a symmetric AC response to the signal detector current input. The circuit is designed to operate at the unity gain frequency. The signal detector is placed between the source (or emitter) electrodes of the transistors which helps to reduces the impact of gate (or base) capacitance on circuit response speed. These factors combined maximize the bandwidth capabilities of circuit. The circuit is responsive to a current input to produce two voltage outputs equal in magnitude but opposite in phase.

14 Claims, 5 Drawing Sheets

DIFFERENTIAL TRANSIMPEDANCE AMPLIFIER

TECHNICAL FIELD

The invention relates to pre-amplifier circuits employed within wideband receivers and more specifically, to transimpedance amplifier circuits employed within opto-electronic receivers used for fiberoptic transmission systems.

BACKGROUND OF THE INVENTION

The demand for high-speed digital communications services, such as data, video, and high-definition TV, is growing. To accommodate these services transmission systems that operate in the multigigabit per second range are being developed with technologists concentrating on developing optical transmission systems because of their large bandwidth capabilities. Such high speed optical transmission systems require wide-band receivers that are capable of receiving the optical signal and providing an electrical signal output. Transimpedance amplifiers are widely used in optical receiver applications as preamplifiers for converting received optical signals into an electrical signal output. However, the bandwidth performance of conventional transimpedance amplifier circuits is limited to a fraction of the bandwidth of the embedded transistors.

To facilitate the discussion that follows, it is important to define two terms of art with regard to bandwidth performance. The first is the frequency where the signal response of the circuit or device drops by 3 dB below the peak response; it is called the −3 dB bandwidth and is denoted as f−3dB. The second is the frequency where the circuit or device produces no gain (0 dB); it is called the unity gain cut-off frequency and is denoted by ft. For conventional transimpedance amplifiers, the f−3dB is determined by the dominant pole defined by the relationship $$\frac{1}{2\pi RC},$$

where R is the value of the feedback resistance and C is the value of the input capacitance at the active transistor's gate (or base). The f−3dB cannot be any larger than the ft of the embedded transistors and, in application, is usually lower than ft by at least a factor A (the open loop voltage gain). Therefore, to improve the bandwidth capability of conventional transimpedance amplifiers, developers have had to try to minimize R or C, or improve the technology of the embedded transistors used in the circuit. However, reducing the value of R increases the circuits susceptibility to external noise and reduces the gain in the circuit, thereby minimizing the effectiveness of the circuit's intended function. The value of the input gate capacitance (C) is a characteristic of the transistors used and whether the input source is capacitively coupled to the transistor gate. In conventional discrete component transimpedance amplifiers, capacitance coupling is used to protect the gate of FET transistors and the base of bipolar transistors from electro-static discharge (ESD). Therefore any effort to reduce C by employing a direct coupling design raises problems with circuit reliability. Otherwise, since the value of C is a function of the transistors used, to improve bandwidth by minimizing C requires changing or improving the transistor technology employed.

One approach to improve the bandwidth performance of transimpedance amplifiers has been to build monolithic transimpedance devices. Such devices eliminate the need for capacitance coupling thereby reducing the value of C. In addition, monolithic devices also minimize the interconnection parasitics, which minimization can improved bandwidth performance. (see Meyer, Blauschild, "A Wide-band Low-noise Monolithic Transimpedance Amplifier", IEEE Journal of Solid State Circuits, Vol SC-21, No. 4, Aug. 1986). Another approach has been to improve the bandwidth of the underlying device technology in a monolithic structure resulting in another step in improved bandwidth performance. One example of such a devices is a single ended high performance transimpedance amplifier using InAlAs/InGaAs heterostructures as shown by Chang et al. ("A 3 GHz Transimpedance OEIC Receiver for 1.3–1.55 μ-m Fiber-Optic Systems", G-K. Chang, W. P. Honig, J. L. Gimlett R. Bhat, C. K. Nguyen, G. Sasaki, and J. C. Yound, IEEE Photonics Letter, Vol. 2, No. 3, March 1990). However, in these examples of prior art the f−3 dB is still significantly lower than the ft of the embedded transistors.

In view of the foregoing, it is an objective of our invention to provide a circuit structure for transimpedance amplifiers that doesn't appreciably limit the bandwidth of the amplifier to below that of the embedded transistors. It is further an object of our invention to provide for a transimpedance amplifier circuit structure with improved noise immunity performance. It is also an object of our invention to obviate the reliability problems caused by direct coupling of the input source to the gate (or base) of the transistor.

SUMMARY OF THE INVENTION

In accordance with our invention, a transimpedance amplifier is designed with a differential amplifier structure, where the active transistors are connected as a common-gate (base) cascode amplifier with a signal detector as an input source connected between the source (emitter) electrodes. The signal detector provides a current input to the circuit structure which results in two changing voltage outputs equal in magnitude but 180 degrees out of phase. It is an additional aspect of our invention that the differential pair in the differential amplifier circuit structure is designed to provide a significant DC voltage differential between the two parallel circuits to properly bias the signal detector while maintaining a nearly identical DC current in each parallel circuit of the differential pair and producing a symmetrical AC response. This design is contrary to conventional wisdom which requires symmetry between the differential pair in the differential amplifier structure.

Differential amplifiers don't employ feedback; therefore, the location of the dominant pole in our invention is determined by the expression $$\frac{g_m}{2\pi C},$$

where gm is the source (emitter) input admittance to the active transistors and C is the gate capacitance. The value of the input impedance $$\left(\frac{1}{g_m}\right)$$

is always significantly smaller than the value of feedback resistance used in prior art structures and therefore results in a significant increase in bandwidth capability. Also, in our invention the output voltage is not dependent upon the transistor current gain, as is the case in the prior art structures, and therefore the inventive circuit is able to operate near the unity gain cut-off frequency of the transistors employed. Furthermore, since the signal input in our invention is connected to the source (or emitter) electrodes of the active transistors and not the gate (or base), capacitance coupling isn't necessary and the reliability problem due to the sensitivity of the gate (base) is eliminated. As a result, our invention obviates the bandwidth and performance limitations of the prior art structures.

DETAILED DESCRIPTION

Functional Model

Figure 1:
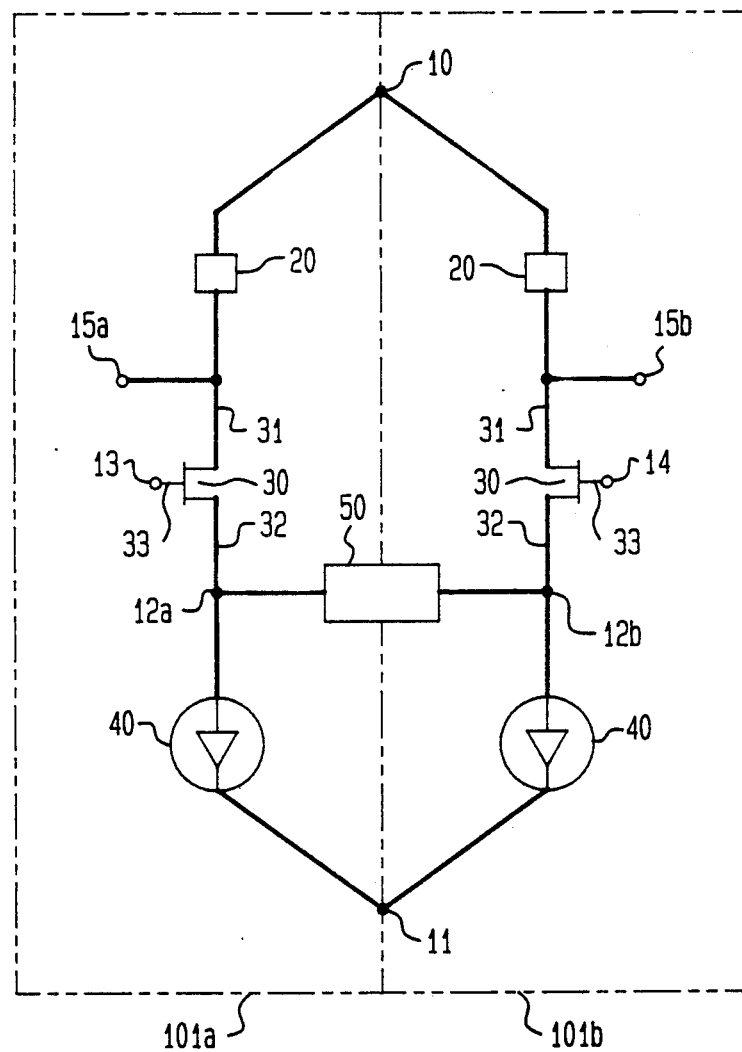
FIG. 1 depicts a functional model of the circuit structure of our invention.
Figure 1A:
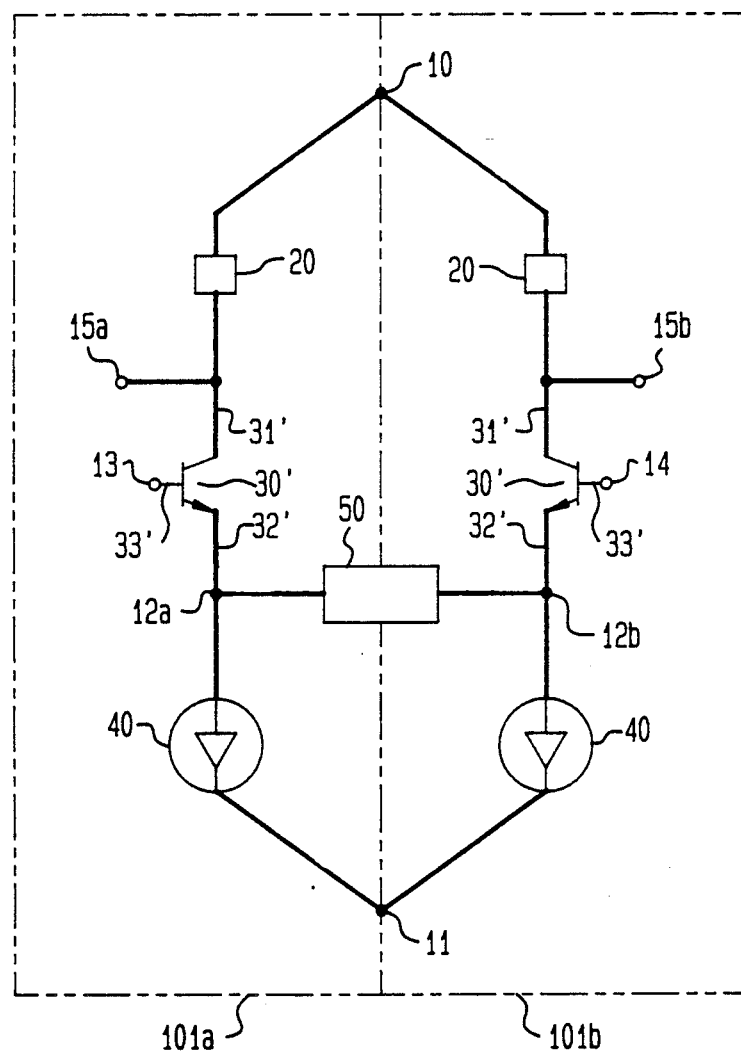
FIG. 1A depicts the functional model of FIG. 1 but utilizing bipolar transistors.

FIG. 1 is a functional model of the circuit structure of our invention employing field effect transistors. Our invention employing bipolar transistors is also depicted in FIG. 1A wherein bipolar transistors 30' have been used in place of the field effect transistors 30 of FIG. 1. It is comprised of two parallel symmetric circuits 101a and 101b. Each circuit is comprised of a load 20, having a resistive component, in series with an output node 15, a transistor 30, and a current source 40. The transistor 30 has three electrodes 31, 32 and 33. For bipolar transistors, as seen in FIG. 1A, electrode 31 is known as the collector, electrode 32 is known as the emitter, electrode 33 is known as the base. For field effect transistors, as seen in FIG. 1, electrode 31 is known as the drain, electrode 32 is known as the source, and electrode 33 is known as the gate. Our invention is not dependent upon the transistor type used for transistor 30.

These two circuits 101a and 101b are connected at three locations: node 10, node 11, and by a signal detector 50 connected between nodes 12a and 12b. DC voltages are applied to nodes 10 and 11 to provide a common voltage differential across each parallel circuit 101a and 101b. Additional DC voltages are applied by nodes 13 and 14 to properly bias the transistors 30 and establish a voltage differential between the two parallel circuits 101a and 101b at nodes 12a and 12b. The values of the DC voltages applied to nodes 10, 11, 13 and 14 are such that, in combination with the parameters of the chosen transistors 30, the voltage differential between nodes 12a and 12b is sufficient to properly bias the signal detector 50.

The voltages applied to the input nodes 10, 11, 13 and 14 bias the transistors 30 so that they operate in the linear region for bipolar transistors or the saturation region for field-effect transistors, i.e. the regions where changes in voltage do not appreciably change transistor. current. The current sources 40 maintain an equal DC current in each parallel circuit 101a and 101b. The equal DC current through each parallel circuit 101a and 101b results in an identical voltage drop across each load 20. Consequently, without any other external stimuli, the voltages measured at output nodes 15a and 15b would be equal. However, when signal energy is detected at the signal detector 50, it is converted to current as input at nodes 12a and 12b. The current provided as input to nodes 12a and 12b increases the current between node 10 and node 12a in circuit 101a and decreases the current flowing from node 10 to node 12b in circuit 101b. As a result the voltage drop across load 20 in circuit 101a increases and the voltage drop across load 20 in circuit 101b decreases. The measured change in the output voltage at node 15b results in a positive pulse in response to a signal pulse received by the signal detector from the signal transmission system. The measured change in the output voltage at node 15a results in a negative pulse in response to the signal pulse received. The measured voltage pulses at nodes 15a and 15b would be equal in magnitude but 180 degrees out of phase.

Figure 2:
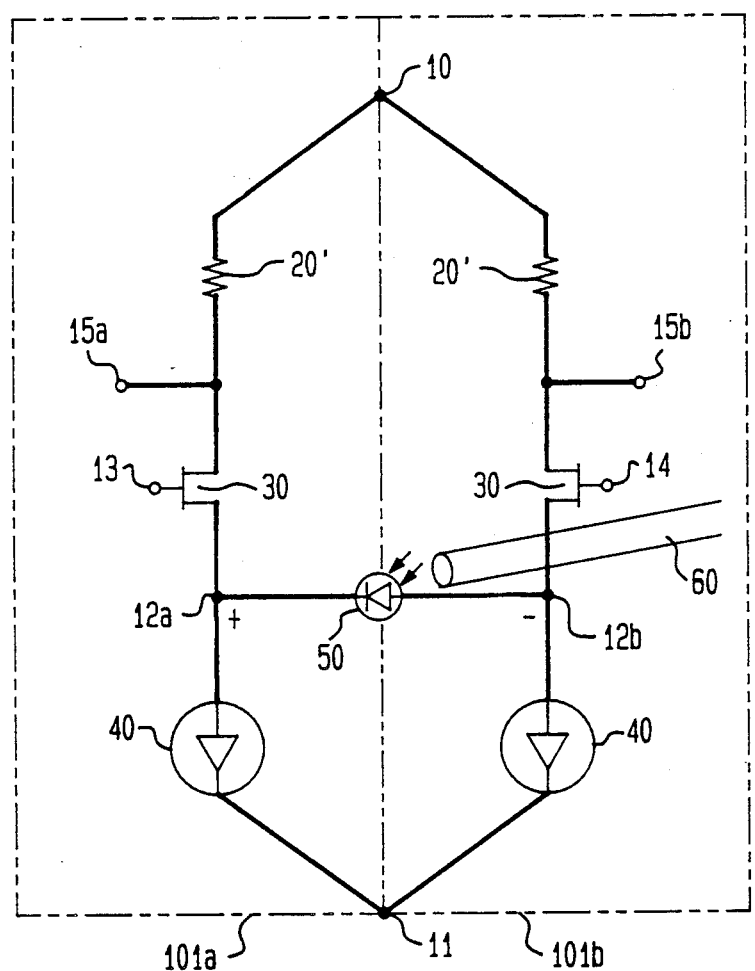
FIG. 2 depicts a functional model of the circuit structure of our invention as employed in a lightwave receiver.

If this differential transimpedance amplifier circuit is used within an optical receiver, the signal detector 50 would be a photodetector and the signal transmission system 60 would be an optical transmission system. The photodetector could be a metal-semiconductor-metal (MSM) photodetector or a P-I-N photodiode. If a P-I-N photodiode is used, it is necessary to maintain a positive bias across the detector from circuit 101a to 101b whereas with an MSM photodetector bias polarity is not important. FIG. 2 depicts our invention as used within an optical receiver and with a P-I-N photodiode 50'. An optical fiber 60 from a fiber optic transmission system is terminated at and optically coupled to the photodetector 50. The received optical signal results in a current input to the differential transimpedance amplifier which, as described above, produces an output voltage responsive to the input.

Figure 3:
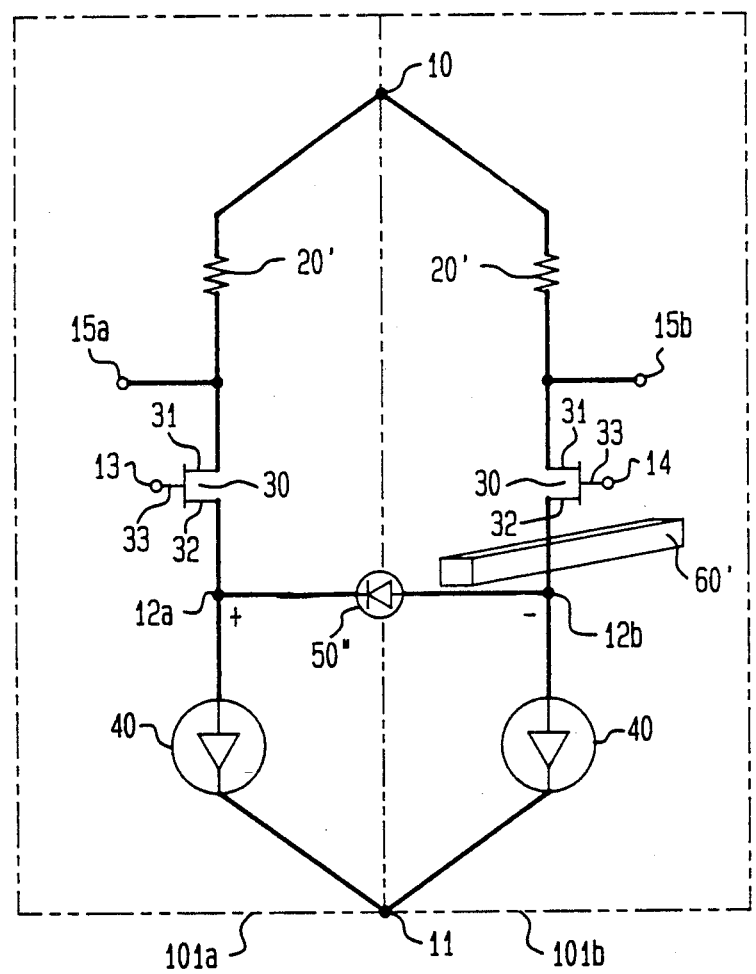
FIG. 3 depicts a functional model of the circuit structure of our invention as employed in a high-speed microwave receiver.

In addition, our invention is not limited to optical receivers. The circuit structure is applicable for any high frequency receiver. The signal detector 50 could be a high-frequency energy detector, an example of which is a millimeter wave detector, and the signal transmission system could be a microwave transmission system. FIG. 3 depicts our invention as used within a wideband microwave receiver. A high frequency waveguide 70 is coupled to a millimeter wave detector 50. The microwave signal received results in a current input to the differential transimpedance amplifier which, as described above, produces an output voltage responsive to the input.

It is not necessary that each circuit 101a and 101b have a separate current source; instead the two current sources could be combined into a signal current source connecting nodes 12a and 12b to node 11 as long as the single current source maintained nearly identical D.C. currents in circuits 101a and 101b.

Our circuit structure is not inherently frequency limited. Ideally, the frequency capability should approach the frequency capability of the embedded transistors 30. However, the impact of the detector capacitance and of the interconnection parasitic capacitance does reduce the performance of the circuit structure to a percentage below that of the unit current gain cut-off frequency of the embedded transistors. The interconnection parasitics can be reduced by integrating the signal detector 50 and the rest of the circuit elements onto the same chip.

SPECIFIC EMBODIMENT OF THE INVENTIVE CIRCUIT

Figure 4:
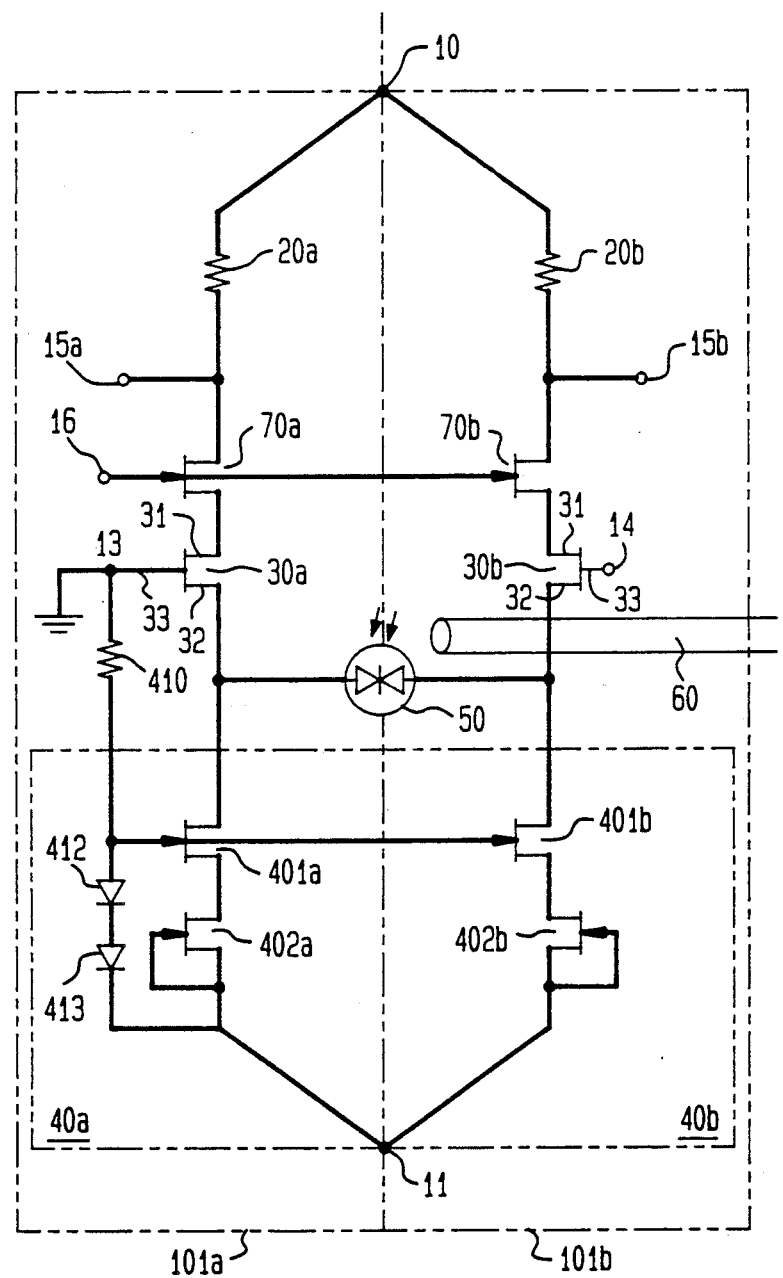
FIG. 4 is an illustrative embodiment of a circuit structure in accordance with our invention.

FIG. 4 is a circuit diagram of an illustrative embodiment of our invention using field transistors (FET) and a metal-semiconductor-metal (MSM) photodetector. To facilitate our explanation of this specific embodiment of our invention, the same reference numbers are used in FIG. 1 and FIG. 4 to identify the equivalent circuit elements. FIG. 4 shows input nodes 10, 11, 13, and 14, and output nodes 15a and b. Transistors 30 from FIG. 1 are shown as FETs 30a and 30b in FIG. 4. The two current source means 40 from FIG. 1 have been expanded in FIG. 2 to show the embedded technology and are shown as sources 40a and 40b.

FETs 30a and b are high electron mobility transistors (HEMT) with 100 μm channel width and 1.3 μm length. Under a −0.7 V bias their unity gain cut-off frequency is 14 GHz. The MSM photodetector 50' is a light triggered current source with a large internal impedance and a low leakage current. Resistors 20a and 20b are the output loads. Current source 40a is made up of a cascode arrangement of transistors 401a and 402a with a third current path from the gate of FET 30a in circuit 101a to node 11. This third current path is comprised of a resistor 410 in series with two diodes 412 and 413. Resistor 410 and diodes 412 and 413 are providing a −1.5 volt reference bias at the gates of transistors 401a and 401b. Current source 40b is made up of a cascode arrangement of transistors 401b and 402b. Transistors 401a and b and 402a and b are also FET, with transistors 401 having a 40 μm channel length and transistors 401 having a 30 μm channel width.

In this specific embodiment of our invention a positive 6 Volt DC source is applied to node 10 and a negative 6 Volt DC source is applied to node 11. A negative 3 Volt DC source is applied to the gate of FET 30b at node 14, and the gate of FET 30a is grounded via node 13. However, the capabilities of transistors 401a and 401b and 402a and 402b chosen for use within the two current source means 40a and 40b do not provide for sufficient equalization in DC bias current in circuits 101a and 101b. They were chosen because their operating characteristics provide the necessary DC voltage stability at nodes 12a and 12b. To further equalize the DC bias current in loop 101a and 101b and to isolate the output form the input, transistors 16a and 167b have been added in a cascode arrangement between nodes 15a and 15b and FET 30a and FET 30b. The gates of these two transistors are biased by a 1.5 Volt DC voltage source.

Upon a lightwave pulse from optical fiber 60 impinging on photodetector 50' the current generated by the photodetector would increase the current between node 10 and node 12a in circuit 101a and decrease the current flowing from node 10 to node 12b in circuit 101b. As a result the voltage drop across resistor 20 in circuit 101a would be increased and the voltage drop across resistor 20 in circuit 101b would be decreased. The measured change in the output voltage at node 15b would result in a positive pulse in response to a lightwave pulse received. The measured change in the output voltage at node 15a would result in a negative pulse in response to the lightwave pulse received. The measured voltage pulses at nodes 15a and 15b would be equal in magnitude but 180 degrees out of phase. In this embodiment transistors 16a and 16b are HEMT with a 40 μm channel length. The operational bandwidth of this specific embodiment of our invention is close to 65% of the unit gain cutoff frequency of FET 30a and 30b. If transistors with sub-micron gates were used the operational bandwidth of the circuit would be in the 10's of GHz range.

Clearly, those skilled in the art recognize that the principles that define our circuit structure are not limited to the embodiment illustrated herein. Other embodiments may be readily devised by those skilled in the art.

What is claimed is:

1. A differential transimpedance amplifier circuit comprising:
   a first and second power source connecting node;
   a first current path between said first and second power source connecting nodes having a first resistor, a first output means, a first transistor, and a first current source means all connected in series, and being connected in parallel to a second current path between said first and second power source connecting nodes having a second resistor, a second output means, a second transistor biased differently from said first transistor, and a second current source means all connected in series; and
   a signal detector directly coupled to and connected between said first and second transistors, such that said signal detector is responsive to a received signal inducing an equal in value but opposite in polarity AC response at each of said output means.

2. The circuit as recited in claim 1 wherein said signal detector comprises a photodetector optically coupled to a lightwave transmission system, said photodetector being responsive to received lightwave energy from the lightwave transmission system for producing an electrical current as input to said first and second transistors resulting in variations in output voltage at each of said output means where the variation in output voltage at one of said output means is equal to but 180 degrees out of phase to the output at the other of said output means.

3. The circuit as recited in claim 1 wherein said signal detector comprises a millimeter wave detector coupled to a microwave transmission system, said millimeter wave detector being responsive to received radio frequency energy from said microwave transmission system for producing an electrical current as input to said first and second transistors resulting in variations in output voltage at each of said output means, where the variation in output voltage at one of said output means is equal to but 180 degrees out of phase to the output at the other of said output means.

4. The circuit as recited in claim 1 wherein said first current source means comprises of least a third and fourth transistor connected in a cascode configuration with said third transistor connected between said first transistor and said second power source connecting node, and wherein said second current source means comprises at least a fifth and sixth transistor connected in a cascode configuration between said second transistor and said second power source connecting node.

5. The circuit as recited in claim 1 wherein said first an second output means are each comprised of an output node and a transistor.

6. The circuitry as recited in claim 1 wherein said first and second transistors are bipolar transistors.

7. The circuitry recited in claim 1 wherein said first and second transistors are field effect transistors.

8. A differential transimpedance amplifier circuit comprising:

a first and second power source connecting node, a first circuit comprised of a first resistor, a first output means, and a first transistor, said first transistor having a first electrode, a second electrode, and a third electrode connected to a first biasing means, said first resistor being connected between said first power source connecting node and said first output means and said output means being connected to said first electrode of said first transistor;

a second circuit comprised of a second resistor a second output means, and a second transistor, said second transistor having a first electrode, a second electrode, and a third electrode connected to a second biasing means different from said first biasing means, said second resistor being connected between first power source connecting node and said output means and said output means being connected to said first electrode of said second transistor;

a signal detector means for detecting and converting signal energy to an electrical current directly coupled and connected between said second electrodes of said first and second transistor; and a current source means connecting said first circuit and said second circuit to said second power source connecting node.

9. The circuitry as recited in claim 8 wherein said signal detector comprises a photodetector optically coupled to a lightwave transmission system whereby said photodetector is responsive to received lightwave energy from the lightwave transmission system for producing an electrical current as input to said first and second circuits producing variations in output voltage at each of said output means, the variation in output voltage of one of said output means being equal to but 180 degrees out of phase to the output at the other of said output means.

10. The circuitry as recited in claim 8 wherein said signal detector comprises a millimeter wave detector coupled to a microwave transmission system whereby said millimeter wave detector is responsive to received radio energy from the microwave transmission system for producing an electrical current as input to said first and second circuits producing variations in output voltage at each of said output means, the variation in output voltage of one of said output means being equal to but 180 degrees out of phase to the output of the other of said output means.

11. The circuitry as recited in claim 8 wherein said current source means comprises at least a third and fourth transistor with said third transistor connected between said first transistor and said second power source connecting node, and said fourth transistor connected between said second transistor and said second power source connecting node.

12. The circuitry as recited in claim 8 wherein said first and second transistors are bipolar transistors and wherein said first electrodes are collector electrodes, said third electrodes are a base electrodes, and said second electrodes are emitter electrodes.

13. The circuitry recited in claim 8 wherein said first and second transistors are field effect transistors with said first electrodes are drain electrodes, said third electrodes are gate electrodes, and said second electrodes are source electrodes.

14. A differential transimpedance amplifier comprising a pair of parallel circuits each comprising in series a load with impedance connected to a first common voltage source, a transistor having first, second, and third electrodes, and a constant current means connected to a second common voltage source, said loads being connected to said first electrodes, said constant current source connected to said third electrodes, and different bias voltages being connected to each of said second electrodes, signal detector means bridging said parallel circuits and directly coupled between said third electrodes, and output means connected to at least one of said transistor first electrodes.

* * * * *